United States Patent
Liu et al.

(10) Patent No.: US 9,784,787 B2
(45) Date of Patent: Oct. 10, 2017

(54) ELECTRIC FIELD SENSOR, SYSTEM, AND METHOD FOR PROGRAMMING ELECTRONIC DEVICES ON A WAFER

(71) Applicant: FREESCALE SEMICONDUCTOR, INC., Austin, TX (US)

(72) Inventors: Lianjun Liu, Phoenix, AZ (US); Philippe Bernard Roland Lance, Toulouse (FR); David Joseph Monk, Mesa, AZ (US); Babak A Taheri, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 120 days.

(21) Appl. No.: 14/850,432

(22) Filed: Sep. 10, 2015

(65) Prior Publication Data

US 2016/0306007 A1    Oct. 20, 2016

(30) Foreign Application Priority Data

Apr. 15, 2015  (WO) .................. PCT/IB2015/000843

(51) Int. Cl.
*G01R 31/28* (2006.01)
*G01R 31/3185* (2006.01)
*G01R 31/302* (2006.01)

(52) U.S. Cl.
CPC ..... *G01R 31/2884* (2013.01); *G01R 31/3025* (2013.01); *G01R 31/318511* (2013.01)

(58) Field of Classification Search
CPC ........ G01R 31/2884; G01R 31/318511; G01R 31/3025; G01R 1/07307
USPC ........................................ 324/750.01–765.01
See application file for complete search history.

(56) References Cited

U.S. PATENT DOCUMENTS

| | | | |
|---|---|---|---|
| 7,325,180 B2 | 1/2008 | Pileggi et al. | |
| 9,607,911 B2 * | 3/2017 | Liu | H01L 22/30 |
| 2002/0075017 A1 * | 6/2002 | Edwards | G01R 31/303 324/754.21 |
| 2005/0231225 A1 * | 10/2005 | Park | B82Y 10/00 324/755.07 |
| 2007/0159193 A1 * | 7/2007 | Min | G11B 9/1409 324/754.27 |

(Continued)

OTHER PUBLICATIONS

Xin'an, "A novel SOI MOSFET electrostatic field sensor", Journal of Semiconductors, Apr. 2010, pp. 045003-1 to 045003-4, vol. 31, No. 4.

*Primary Examiner* — Jeff Natalini
(74) *Attorney, Agent, or Firm* — Charlene R. Jacobsen (57) ABSTRACT

An electric field sensor includes sense and reference cells. The sense cell produces a resistance that varies relative to an intensity of an electric field, and the reference cell produces a resistance that is invariable relative to the intensity of the electric field. An output signal indicative of the intensity of the electric field is determined using the difference between the resistances. A system includes an electric field source that outputs a digital test program as an electric field signal. The system further includes the electric field sensor formed with IC dies on a wafer. The electric field sensor receives the electric field signal. The received electric field signal is converted to the test program, and the test program is stored in memory on the wafer. The electric field source does not physically contact the dies, but can flood an entire surface of the wafer with the electric field signal.

14 Claims, 7 Drawing Sheets

(56) References Cited

U.S. PATENT DOCUMENTS

| | | | |
|---|---|---|---|
| 2011/0109368 A1* | 5/2011 | Boulin | H03K 17/96 327/306 |
| 2015/0136853 A1* | 5/2015 | Palmer | G06K 19/067 235/451 |
| 2015/0276607 A1* | 10/2015 | Nakanishi | G01N 21/9501 250/459.1 |
| 2016/0274188 A1* | 9/2016 | Liu | G01R 31/318511 |
| 2016/0276004 A1* | 9/2016 | Lance | G11C 5/147 |

* cited by examiner

ELECTRIC FIELD SENSOR, SYSTEM, AND METHOD FOR PROGRAMMING ELECTRONIC DEVICES ON A WAFER

TECHNICAL FIELD OF THE INVENTION

The present invention relates generally to integrated circuits. More specifically, the present invention relates to an electric field sensor, a system, and a method for programming electronic devices on a wafer for wafer level testing.

BACKGROUND OF THE INVENTION

Wafer level probing and/or wafer level chip scale package (WLCSP) testing of a complimentary metal-oxide-semiconductor (CMOS) wafer containing a plurality of integrated circuit (IC) dies typically requires communication between the external test equipment (e.g., tester) and the device under test (e.g., an IC die). A primary aspect of the communication is to download a test program from the tester to each IC die on the wafer and then receive the test results to determine whether the IC die under test is a good die or a bad die.

IC dies are increasingly being fabricated with a build-in self-test (BIST) mechanism or function. A BIST function or mechanism permits an IC die to verify all or a portion of the internal functionality of the IC die. Inclusion of a BIST can reduce reliance upon and/or the complexity of external test equipment, thereby reducing test costs. For example, with the inclusion of the BIST mechanism at each IC die, a test program downloaded from the tester may simply initiate execution of the BIST, receive the test result (e.g., pass/fail) from the BIST, and communicate that result back to the tester.

Thus, with the inclusion of a BIST mechanism, wafer level testing is becoming faster due to a reduction in communication between the tester and the devices under test. However, wafer level testing typically entails a process of die-by-die programming and testing in which a probe of the tester must index or step between each of the IC dies on the wafer. The process of indexing or stepping between each of the IC dies on the wafer to perform die-by-die programming and testing is still undesirably time consuming and costly. Therefore, a need exists in the art of wafer level testing to increase the speed of testing and thereby decrease the costs associated with testing.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

DETAILED DESCRIPTION

In overview, embodiments of the present invention entail an electric field sensor, a system, and methodology for programming integrated circuit (IC) dies formed on or in a wafer. The system includes an electric field source located at, for example, a probe card of a wafer tester and one or more electric field sensors formed with the IC dies on the wafer. The electric field source outputs a test program in the form of an electric field signal that is detectable by receiving devices, e.g., the electric field sensors. This electric field signal is converted back to the test program and the test program is stored in association with each of the IC dies. By utilizing an electric field programming approach, all of the IC dies on the wafer can be programmed concurrently without the need for communication between the tester and each individual IC die. Accordingly, test time and cost can be dramatically reduced. Furthermore, by combining the electric field programming approach for download of a test program with built-in self-test (BIST) functionality, wafer level testing/probing of the IC dies can be carried out without indexing or stepping the tester between each of the IC dies on the wafer.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued. It should be further understood that the use of relational terms, if any, such as first and second, top and bottom, and the like are used solely to distinguish one from another entity or action without necessarily requiring or implying any actual such relationship or order between such entities or actions.

Figure 1:
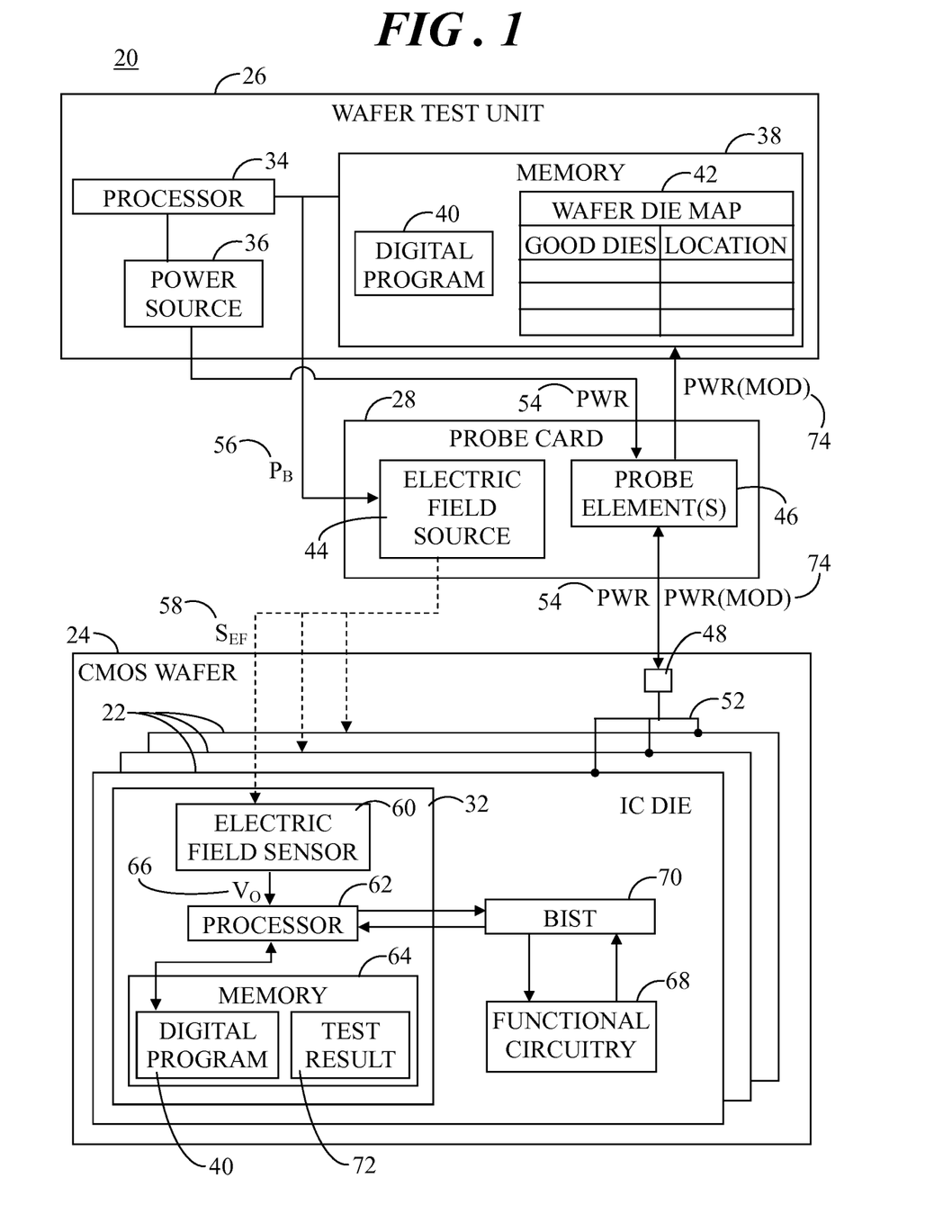
FIG. 1 shows a block diagram of a system for programming and testing integrated circuit (IC) dies formed on or in a wafer in accordance with an embodiment.

Referring now to FIG. 1, FIG. 1 shows a block diagram of a system 20 for remote programming and testing integrated circuit (IC) dies 22 formed on or in a wafer 24 in accordance with an embodiment. IC dies 22 may encompass microprocessors, microcontrollers, static random access memory (RAM), and other digital logic circuits fabricated in accordance with complementary metal-oxide-semiconductor (CMOS) process technology. IC dies 22 may further encompass some analog circuits such as CMOS image sensors, data converters, radiofrequency (RF) transceivers, operational amplifiers, and the like. In accordance with CMOS process technology, IC dies 22 of wafer 24 use a combination of p-type and n-type metal-oxide-semiconductor field-effect-transistors (MOSFETs) to implement logic gates and other digital circuits.

For simplicity of illustration in the block diagram of FIG. 1, wafer 24 is represented by a rectangle and the multiple IC dies 22 are represented by a series of three rectangles that appear to be stacked one on top of the other. It should be readily apparent to those skilled in the art that IC dies 22 are not formed in a stacked relationship on a rectangular wafer 24. Rather the multiple IC dies 22 of wafer 24 are laterally spaced from one another relative to the plane of wafer 24.

System 20 generally includes a wafer test unit 26 having a probe card 28, and a plurality of subsystems 32 formed on wafer 24. Wafer test unit 26 may be a conventional tester, sometimes referred to as a wafer prober, used to test integrated circuits. Wafer test unit 26 can include one or more processors 34, one or more power sources 36, and a memory element 38. In general, processor 34 may control the operation of probe card 28 and power source 36. Processor 34 may additionally, or alternatively, enable access to and from memory element 38. Those skilled in the art will recognize that wafer test unit 26 can include a variety of functional elements and mechanisms for loading and unloading wafer 24 onto a wafer chuck, pattern recognition optics for suitably aligning wafer 24 on the wafer chuck, and so forth. Details of these additional functional elements and mechanisms will not be explained in any greater extent than that considered necessary for the understanding and appreciation of the underlying concepts of the examples set forth herein and in order not to obscure or distract from the teachings herein.

Memory element 38 may have a digital test program 40 and a wafer die map 42, sometimes referred to as a wafermap, stored therein. As will be discussed in significantly greater detail below, digital test program 40 is used by system 20 to test IC dies 22 on wafer 24. Information regarding those IC dies 22 that are good, i.e., passing, may be stored in wafer die map 42 along with their locations on wafer 24. Wafer die map 42 may be used to categorize the passing and non-passing IC dies 22 by making use of bins. A bin can then be identified as containing good dies or as containing bad dies. Wafer die map 42 can then be sent to subsequent die handling equipment which only picks up the passing IC dies 22 by selecting the bin number of the good IC dies 22. In other systems, non-passing IC dies 22 may be marked with a small dot of ink in the middle of the dies in lieu of wafer die map 42. When ink dots are used, vision systems on subsequent die handling equipment can disqualify the IC dies 22 by recognizing the ink dot.

System 20 is particularly configured to enable non-contact communication of digital test program 40 from wafer test unit 26 to wafer 24. To that end, an electric field source 44 is coupled to probe card 28. However, IC dies 22 must be energized prior to communication of digital test program 40 from wafer test unit 26 to wafer 24. Thus, at least one probe element 46 is additionally coupled to probe card 28. Probe element 46 is configured for touch down on at least one probe pad 48 on wafer 24. Probe pad 48, in turn, may be interconnected with one or more IC dies 22 via electrically conductive traces 52 to provide power to IC dies 22. As such, source power 54, labeled PWR, can be provided from power source 36 to each of IC dies 22 on wafer 24 via probe element 46, probe pad 48 and conductive traces 52 in order to energize the circuitry of IC dies 22.

After IC dies 22 are energized, subsystems 32 (one each of which is associated with one each of IC dies 22), can be programmed and IC dies 22 may be tested. In an embodiment, processor 34 accesses digital test program 40 from memory element 38 and converts digital test program 40 into a sequence of signals that are representative of digital test program 40. By way of example, digital test program 40 may be converted to its corresponding binary code, in the form of binary digits (e.g., 0's and 1's). This series of binary digits is referred to herein as binary code 56, and is labeled $P_B$ in FIG. 1.

Binary code 56 can be communicated from wafer test unit 26 to electric field source 44. Electric field source 44 does not physically contact IC dies 22 of wafer 24. Instead, electric field source 44 can include an electrode (not shown) that outputs an electric field, referred to herein as an electric field signal 58, labeled $S_{EF}$, corresponding to binary code 56. Electric field signal 58 is emitted from electric field source 44 over a relatively short distance and has an intensity that varies in accordance with binary code 56. In some embodiments, electric field source 44 can include only one electrode of a size sufficient to flood the entire wafer 24. In other embodiments, electric field source 44 can include more than one electrode so that electric field signal 58 may be output from the multiple electrodes, in a serial or parallel manner, to collectively flood the entire wafer 24.

Accordingly, electric field signal 58 is represented by a series of dashed lines to indicate its communication to wafer 24 via non-physical contact. Again by way of example, the output electric field (i.e., electric field signal 58) may include two intensities or magnitudes, where one intensity corresponds to a "0" in binary code 56 and another intensity corresponds to a "1" in binary code 56. In an example embodiment, electric field source 44 can modulate binary code 56 as a sequence of pulses of the electric field (e.g., ON and OFF pulses) to generate electric field signal 58. It should be understood however, that digital test program 40 may be converted into any suitable code that is thereafter output from electric field source 44 as electric field signal 58.

Each of subsystems 32 includes an electric field sensor 60 formed with its associated IC die 22, a processor 62 in communication with electric field sensor 60, and a memory element 64 in communication with processor 62. Electric field sensor 60 is adapted to detect and receive electric field signal 58. In operation, electric field sensor 60 can sense, for example, the sequence of pulses of the electric field (e.g., ON and OFF pulses) of electric field signal 58. Electric field sensor 60 may include MOSFETs arranged as, for example, sense cells and reference cells in a Wheatstone bridge circuit configuration. As such, electric field sensor 60 can be readily fabricated in accordance with the process flow for constructing IC dies 22. In an embodiment, the Wheatstone bridge circuit varies its output voltage in response an electric field, e.g., electric field signal 58. Electric field sensor 60 will be described in greater detail in connection with FIGS. 4-6.

Electric field sensor 60 can decode the sensed electric field signal 58 and communicate electric field signal 58 as an output voltage 66, labeled $V_O$, to processor 62. In an embodiment, output voltage 66 corresponds with binary code 56. As such, processor 62 can convert or otherwise determine digital test program 40 from output voltage 66. Accordingly, processor 62, in cooperation with electric field sensor 60, is adapted to convert electric field signal 58 to digital test program 40. Thereafter, processor 62 communicates digital test program 40 to memory element 64, where digital test program 40 is stored.

In accordance with a particular embodiment, electric field source 44 is configured to flood an entire surface of wafer 24 with electric field signal 58. Thus, each of subsystems 32 concurrently receives electric field signal 58, converts electric field signal 58 to digital test program 40, and stores digital test program 40 in memory element 64 of its corresponding IC die 22. Consequently, digital test program 40 can be loaded to all of IC dies 22 on wafer 24 in parallel via a remote electric field programming approach with electric field sensors 60 being the receiving elements without the need for physical communication from wafer test unit 26 on a die-by-die basis to each individual IC die 22.

Each of IC dies 22 includes functional circuitry 68. Additionally, each of IC dies 22 may include a built-in self-test (BIST) mechanism 70, or BIST processor. BIST mechanism 70 permits each of IC dies 22 to test itself in order to determine the functionality of its associated IC die 22. By way of example, BIST mechanism 70 functions to verify all or a portion of the internal functionality of its corresponding IC die 22 and produce a test result 72 of that functionality. Thus, BIST mechanism 70 can be implemented to perform faster, less-expensive integrated circuit testing.

In a wafer level testing scenario, processor 62 functions as a BIST controller and digital test program 40 includes a minimal set of instructions for initiating execution of BIST mechanism 70, receiving and storing test result 72 in memory element 64, and thereafter communicating test result 72 to wafer test unit 26. In an embodiment discussed below, processor 62 may modulate source power 54 in accordance with test result 72 to produce modulated source power 74, labeled PWR(MOD). Modulated source power 74 containing test result 72 can then be returned to wafer test unit 26 via probe element 46.

In one example, test result 72 may be a simple PASS or FAIL result. In an embodiment, modulated source power 74 may be produced by modulating the voltage of source power 54 provided to IC dies 22. For example, the voltage may be modulated to produce one voltage magnitude for a PASS result and a different voltage magnitude for a FAIL result. In another embodiment, processor 62 may modulate the current of source power 54 in accordance with test result 72 to produce a modulated source power 74. By way of example, the current may be modulated to produce higher current (e.g., higher power) for a PASS result and a lower current (e.g., lower power) for a FAIL result. Modulated source power 74 containing test result 72 can then be return to wafer test unit 26 via probe element 46.

Accordingly, execution of each digital test program 40, loaded to all of IC dies 22 on wafer 24 in parallel via a remote electric field programming approach, controls operation of BIST mechanism 70 on each IC die 22. Therefore, all IC dies 22 on wafer 24 can be tested and probed without the need for wafer test unit 26 to program each IC die 22 with digital test program 40 individually in series, without executing BIST mechanism 70 of each IC die 22 individually in series, and without requiring physical die-by-die indexing of probe element 46 to receive test result 72. Thus, each of IC dies 22 may be tested in parallel which can significantly reduce test time for an entire wafer 24 and therefore significantly reduce test costs.

Figure 2:
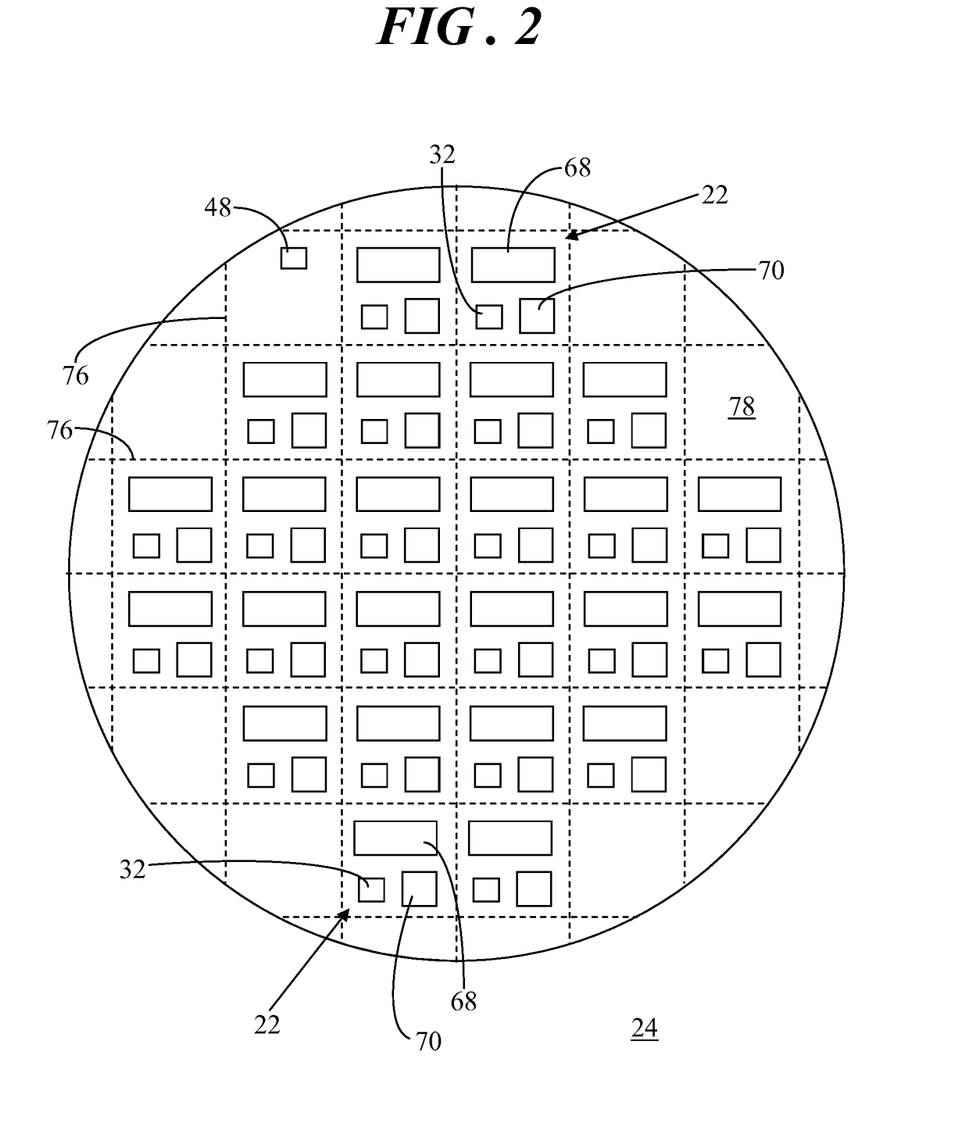
FIG. 2 shows a simplified top view of the wafer of FIG. 1.

FIG. 2 shows a simplified top view of wafer 24 of FIG. 1 on or in which IC dies 22 are formed. Each of IC dies 22 can include functional circuitry 68, BIST mechanism 70, and subsystem 32. Additionally, wafer 24 can include probe pad 48 located in an unused portion of wafer 24, such as at an outer periphery of wafer 24. Conductive traces 52 (FIG. 1), as well as other unspecified interconnections, are not shown for simplicity. Wafer 24 includes only a few IC dies 22 for simplicity of illustration. Those skilled in the art will recognize that a single wafer can include hundreds, thousands, or even tens of thousands of individual IC dies 22.

IC dies 22 are separated by scribe lines 76 formed in a surface 78 of wafer 24. A first set of scribe lines 76 may extend parallel to one another in one direction, i.e., horizontally across a surface 78 of wafer 24. Another set of scribe lines 76 may extend substantially parallel to one another across surface 78 of wafer 24 in a different direction or substantially orthogonal to the first set of scribe lines 76. Scribe lines 76 may form substantially square or rectangular areas, each of which define IC die 22 or semiconductor chip. Scribe lines 76 can be used to separate each of IC dies 22 after fabrication. In an example, each subsystem 32 is located within an area circumscribed by scribe lines 76. However, scribe lines 76 may have a predetermined width that permits subsystems 32 and/or conductive traces 52 (shown in FIG. 1) to be located within scribe lines 76. Thus, IC dies 22 may be tested at wafer level, i.e., prior to dicing, during the manufacturing process.

Each subsystem 32 is located within an area circumscribed by scribe lines 76 to emphasize that each IC die 22 may have electric field sensor 60, processor 62, and memory element 64 (FIG. 1) associated with it. It should be understood that various alternative subsystem configurations may be envisioned. For example, one electric field sensor 60 may be associated with more than one IC die 22 but less than all of the IC dies 22 on wafer 24 and communicate its output via conductive lines (not shown) to a plurality subsystems associated with the subset of IC dies 22, where each of the subsystems includes one of processors 62 and memory elements 64. Furthermore, a single probe pad 48 is shown for simplicity of illustration. However, wafer 24 can include multiple probe pads 48, each of which can communicate source power 54 (FIG. 1) to a subset of IC dies 22.

Figure 3:
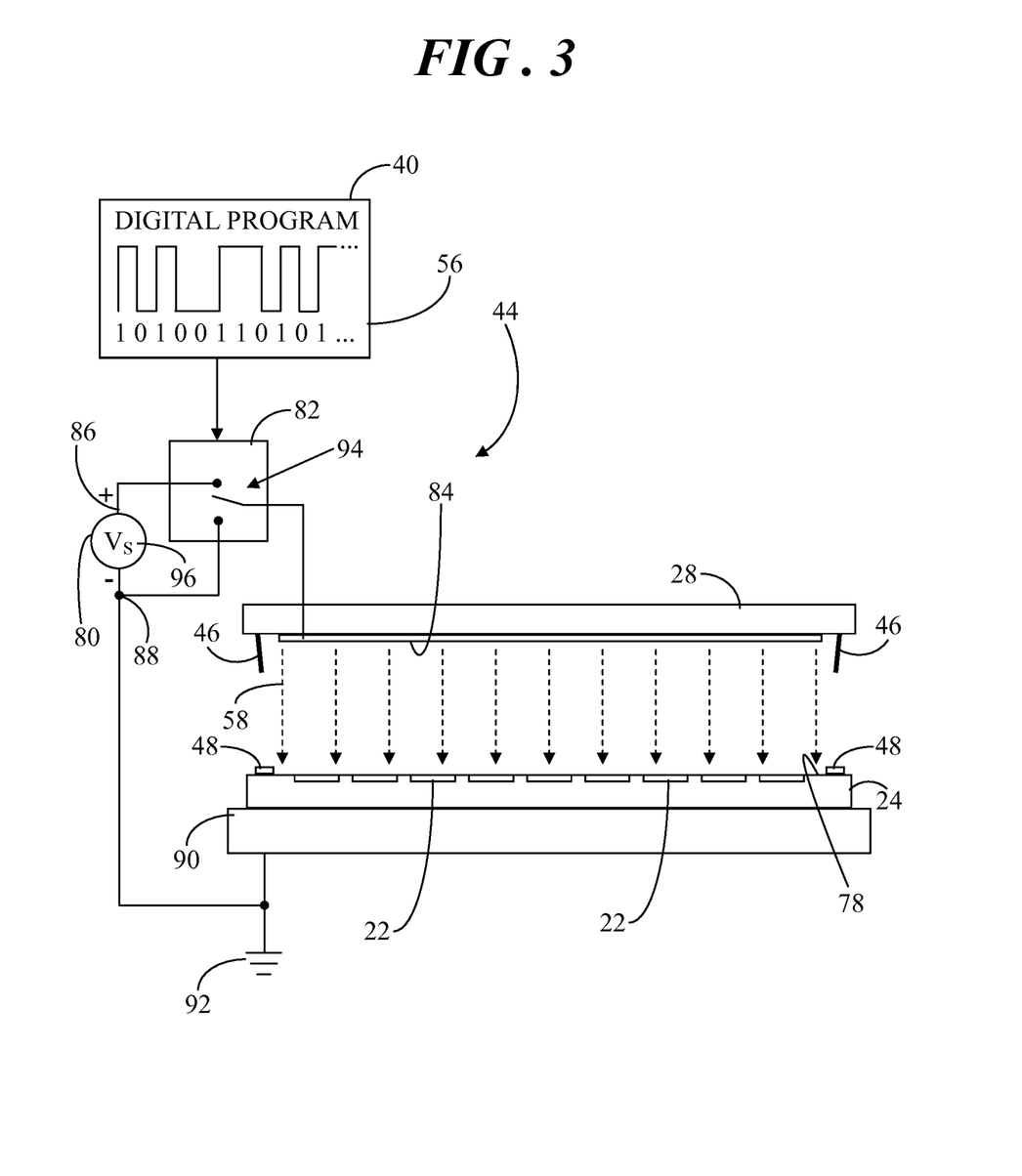
FIG. 3 shows a simplified side view of a probe card of the system and a wafer under test.

FIG. 3 shows a simplified side view of probe card 28 of system 20 (FIG. 1) and wafer 24 under test. Wafer 24 is shown with a number of IC dies 22 formed therein, where each IC die 22 includes functional circuitry 68 (FIG. 1), BIST mechanism 70 (FIG. 1), and one of subsystems 32 (FIG. 1) that includes electric field sensor 60 (FIG. 1) for receiving electric field signal 58. Probe elements 46 are coupled to probe card 28. Probe elements 46 touch down onto probe pads 48 formed on wafer 24 to provide source power 54 (FIG. 1). Although only two probe elements 46 are shown, any suitable quantity of probe elements 46 may be provided on probe card 28.

In an embodiment, electric field source 44 includes a voltage source 80, control electronics 82, and at least one electrode 84. Voltage source 80 has a first terminal 86 and a second terminal 88. Second terminal 88 may be electrically coupled to a wafer chuck 90 to which wafer 24 is coupled. Additionally, second terminal 88 and wafer chuck 90 may be electrically coupled to a common return path, or ground 92. Electrode 84 is coupled to probe card 28 and provides electric field signal 58 without physically contacting IC dies 22 or wafer 24. Although only one electrode 84 is shown, any suitable quantity of electrodes 84 may be provided on probe card 28 to flood an entirety of surface 78 of wafer 24 with electric field signal 58.

As mentioned previously, processor 34 (FIG. 1) converts digital test program 40 into a sequence of signals that are representative of digital test program 40. By way of example, digital test program 40 may be converted to its corresponding binary code 56, in the form of binary digits (e.g., 0's and 1's). Control electronics 82 includes switching circuitry 94 for converting binary code 56 into electric field signal 58. Again by way of example, switching circuitry 94 may switch to first terminal 86 of voltage source 80 to provide a predetermined voltage 96, labeled $V_s$, for each binary digit "1". Additionally, switching circuitry 94 may switch to second terminal 88 of voltage source 80 shorted to ground 92 for each binary digit "0." Accordingly, electric field signal 58 is produced by variably switching, or pulsing, between predetermined voltage 96 and ground 92 in accordance with binary code 56. Thus, electric field source 44 floods the entire surface 78 of wafer 24 with electric field signal 58 to enable parallel programming of all of IC dies 22 on wafer 24 via a remote electric field programming approach. Although control electronics 82 is shown with only switching circuitry 94, control electronics 82 may additionally include filters for removing high frequency noise and/or other components for assuring output of electric field signal 58.

Figure 4:
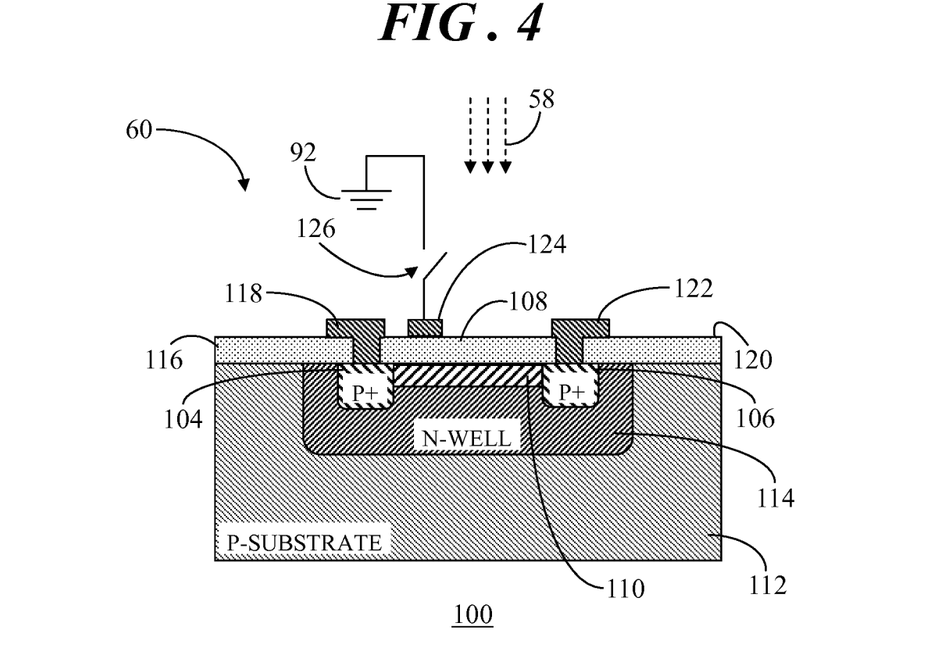
FIG. 4 shows a simplified side sectional view of a sense cell of an electric field sensor that may be implemented in the system of FIG. 1.
Figure 5:
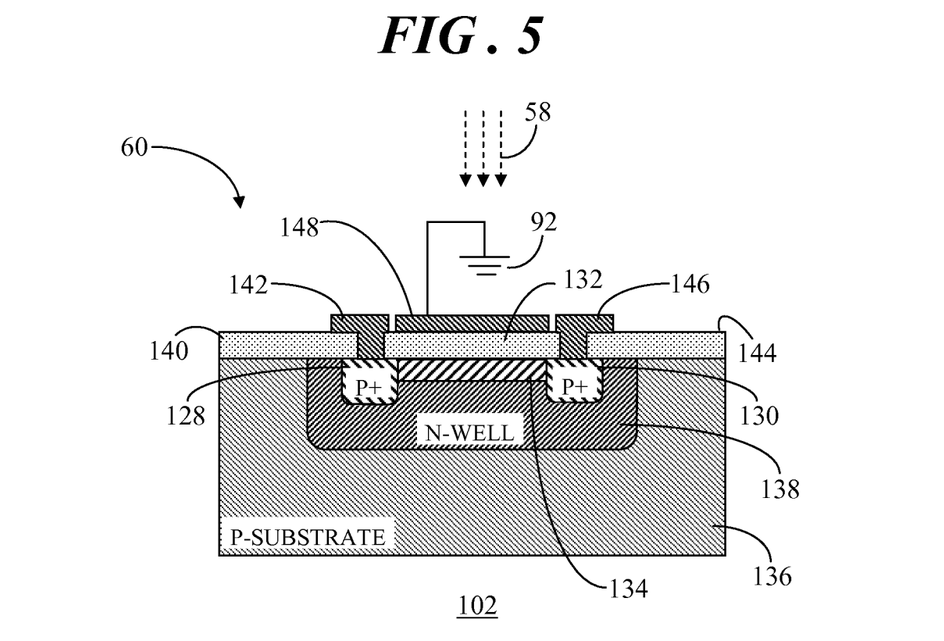
FIG. 5 shows a simplified side sectional view of a reference cell of an electric field sensor that may be implemented in the system of FIG. 1.

Referring to FIGS. 4-5, FIG. 4 shows a simplified side view of a sense cell 100 of electric field sensor 60 implemented in system 20 (FIG. 1) and FIG. 5 shows a simplified side view of a reference cell 102 of electric field sensor 60. As mentioned previously, sense cell 100 and reference cell 102 may be MOSFET devices that are readily fabricated in accordance with the process flow for constructing IC dies 22 (FIG. 1). In an example, sense and reference cells 100, 102 are p-type MOSFET devices. However, in alternative embodiments, sense and reference cells 100, 102 may be n-type MOSFET devices. FIGS. 4 and 5 are illustrated using various shading and/or hatching to distinguish the different elements of sense and reference cells 100, 102, as will be discussed below. These different elements may be produced utilizing current and upcoming CMOS process techniques.

With particular reference to FIG. 4, sense cell 100 includes a source region 104 (P+), a drain region 106 (P+), and a gate region 108. A resistance channel 110 electrically interconnects source region 104 with drain region 106. In the illustrated embodiment, sense cell 100 is constructed on a p-type substrate 112, with source region 104, drain region 106, and resistance channel 110 being manufactured in an n-type well, or n-well 114. An oxide layer 116 is interposed between gate region 108 and resistance channel 110. A metalized source electrode 118 extends from an exterior surface 120 of oxide layer 116 and through oxide layer 116 to electrically couple with source region 104. Similarly, a metalized drain electrode 122 extends from exterior surface 120 and through oxide layer 116 to electrically couple with drain region 106.

A portion of oxide layer 116 bounded by source and drain electrodes 118, 112 and in direct contact with resistance channel 110 forms gate region 108. However, sense cell 100 lacks a metalized gate electrode covering resistance channel 110. Instead, gate region 108, as a gate oxide layer, and resistance channel 110 are exposed directly to electric field signal 58 (FIG. 3). Electric field signal 58 penetrates resistance channel 110 thus causing the thickness of resistance channel 110 and hence, the channel resistance of channel 110, to change with the electric field. Accordingly, sense cell 100 produces a resistance which varies in accordance with an intensity of electric field signal 58. It is this variable resistance that may be utilized to determine digital program 40 (FIG. 3) from electric field signal 58, as will be discussed below.

In some instances, surface 78 (FIG. 3) of wafer 24 (FIG. 3) may have surface charges that can cause variation in the resistance of resistance channel 110. Oxide layer 116 may be coplanar with surface 78 of wafer 24. Accordingly, sense cell 100 further includes a grounding element 124, e.g. a metalized ground electrode, formed on oxide layer 116 at exterior surface 120. Grounding element 124 is selectively coupled to a common return path, i.e., ground 92, via a switching feature 126. Switching feature 126 can include a suitable combination of switching and control circuitry. In an embodiment, grounding element 124 is at least briefly coupled to ground 92 via switching feature 126 and then decoupled from ground prior to detection of the resistance of resistance channel 110 in response to electric field signal 58. These coupling and decoupling operations using switching feature 126 effectively bleed off, i.e., remove, surface charges from surface 78 of wafer 24, and more critically from gate region 108 of sense cell 100. Thereafter, gate region 108 may be considered a floating gate.

Now with particular reference to FIG. 5, reference cell 102 is similar to sense cell 100. As such, reference cell 102 includes a source region 128 (P+), a drain region 130 (P+), a gate region 132, and a resistance channel 134 electrically interconnecting source region 128 with drain region 132. In the illustrated embodiment, reference cell 102 is constructed on a p-type substrate 136, with source region 128, drain region 130, and resistance channel 134 being manufactured in an n-type well, or n-well 138. An oxide layer 140 is interposed between gate region 132 and resistance channel 134. A source electrode 142 extends from an exterior surface 144 of oxide layer 140 and through oxide layer 140 to electrically couple with source region 128. Similarly, a drain electrode 146 extends from exterior surface 144 and through oxide layer 140 to electrically couple with drain region 132.

Unlike sense cell 100, however, reference cell includes a gate electrode 148 in direct contact with gate region 132. Gate electrode 148 is coupled to a common return path, i.e., ground 92. Due to the presence of gate electrode 148 coupled to ground 92, reference cell 102 produces a resistance that is substantially invariable relative to the intensity of electric field signal 58. The difference between the resistance produced at sense cell 100 and the reference cell 102 can be used to determine the intensity of electric field signal 58.

Figure 6:
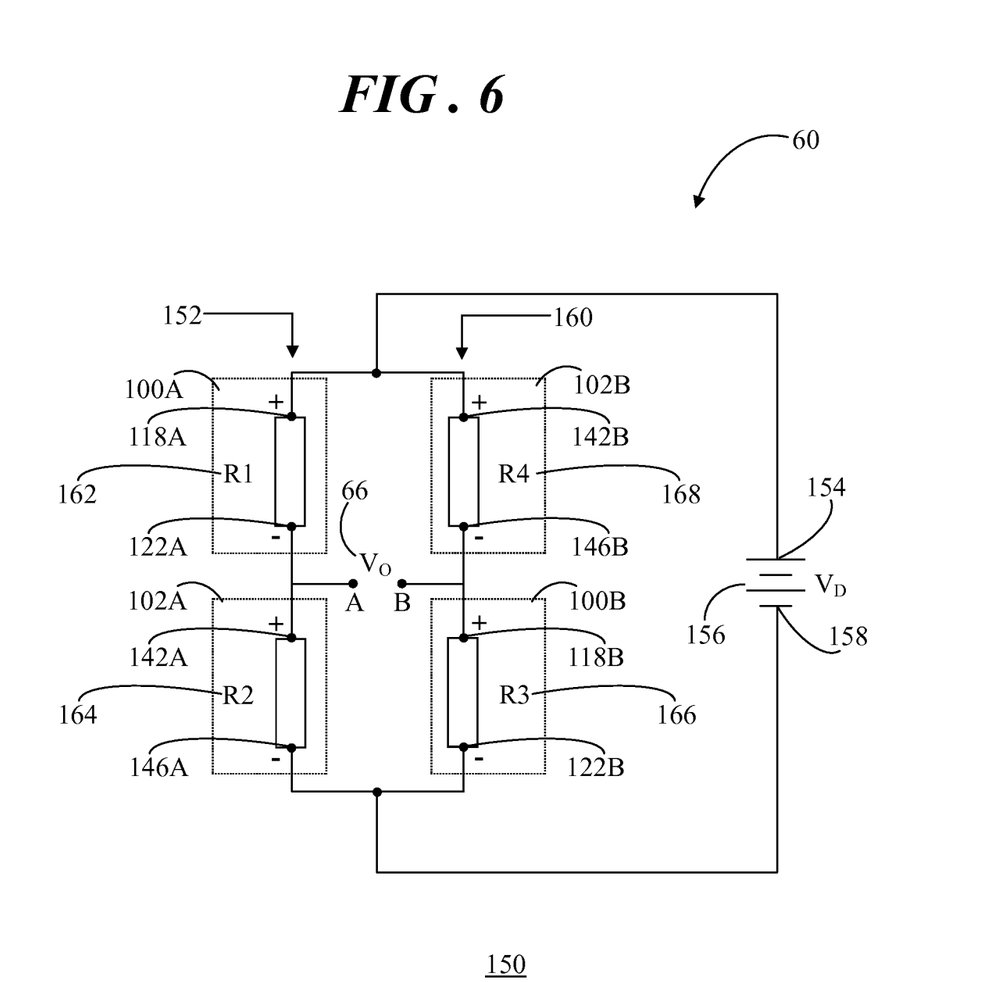
FIG. 6 shows a block diagram of a Wheatstone bridge circuit that may be formed using the sense and reference cells of the electric field sensor.

FIG. 6 shows a block diagram of a Wheatstone bridge circuit 150 that may be formed using the sense and reference cells 100, 102 of electric field sensor 60. In this example, two sense cells 100 (shown generally in dotted line form) and two reference cells 102 (shown generally in dotted line form) are connected to define Wheatstone bridge circuit 150. A first sense cell 100 is labeled 100A and a first reference cell 102 is labeled 102A. Thereafter, the letter "A" is utilized in combination with the reference numerals to identify the particular features of first sense cell 100A and first reference cell 102A. Likewise, a second sense cell 100 is labeled 100B and a second reference cell 102 is labeled 102B. Thereafter, the letter "B" is utilized in combination with the reference numerals to identify the particular features of second sense cell 100B and second reference cell 102B.

First sense cell 100A and first reference cell 102A are serially connected in a first half 152 of Wheatstone bridge circuit 150. More specifically, source electrode 118A for first sense cell 100A is connected to a first terminal 154 of a constant voltage source 156, labeled $V_D$. Drain electrode 122A for first sense cell 100A is connected to source electrode 142A for first reference cell 102A, and drain electrode 146A for first reference cell 102A is connected to a second terminal 158 of constant voltage source 156.

Second reference cell 102B and second sense cell 102B are serially connected in a second half 160 of Wheatstone bridge circuit 150. More specifically, source electrode 142B for second reference cell 102B is connected to first terminal 154 of constant voltage source 156 and to source electrode 118A of first sense cell 100A. Drain electrode 146B for second reference cell 102B is connected to source electrode 118B for second sense cell 100B, and drain electrode 122B for second sense cell 100B is connected to second terminal 158 of constant voltage source 156 and to source electrode 146A of first reference cell 102A.

First sense cell 100A produces a first resistance 162, labeled R1. First reference cell 102A produces a second resistance 164, labeled R2. Second sense cell 100B produces a third resistance 166, labeled R3. And, second reference cell 102B produces a fourth resistance 168, labeled R4. As discussed previously, the resistances (e.g., first and third resistances 162, 166) of first and second sense cells 100A, 100B vary in accordance with the intensity of electric field signal 58 (FIG. 3). However, the resistances (e.g., second and fourth resistances 164, 168) of first and second reference cells 102A, 102B are substantially invariable relative to the intensity of electric field signal 58. Accordingly, in Wheatstone bridge circuit 150, output voltage 66, $V_O$, is the difference between point A and point B in Wheatstone bridge circuit 150, as follows:

$$V_O = V_B - V_A = \frac{R3}{R4+R3}V_D - \frac{R2}{R2+R1}V_D$$

Wheatstone bridge circuit 150 may be implemented to determine an output signal, e.g. output voltage 66, indicative of the intensity of electric field signal 58 from the variable first and third resistances 162, 166 relative to the substantially invariable second and fourth resistances 164, 168. In an embodiment, output voltage 66 varies in accordance with binary code 56 discussed in connection with FIG. 3. Furthermore, implementation of Wheatstone bridge circuit 150 can cancel error that may be present in output voltage 66 due to process variation.

Figure 7:
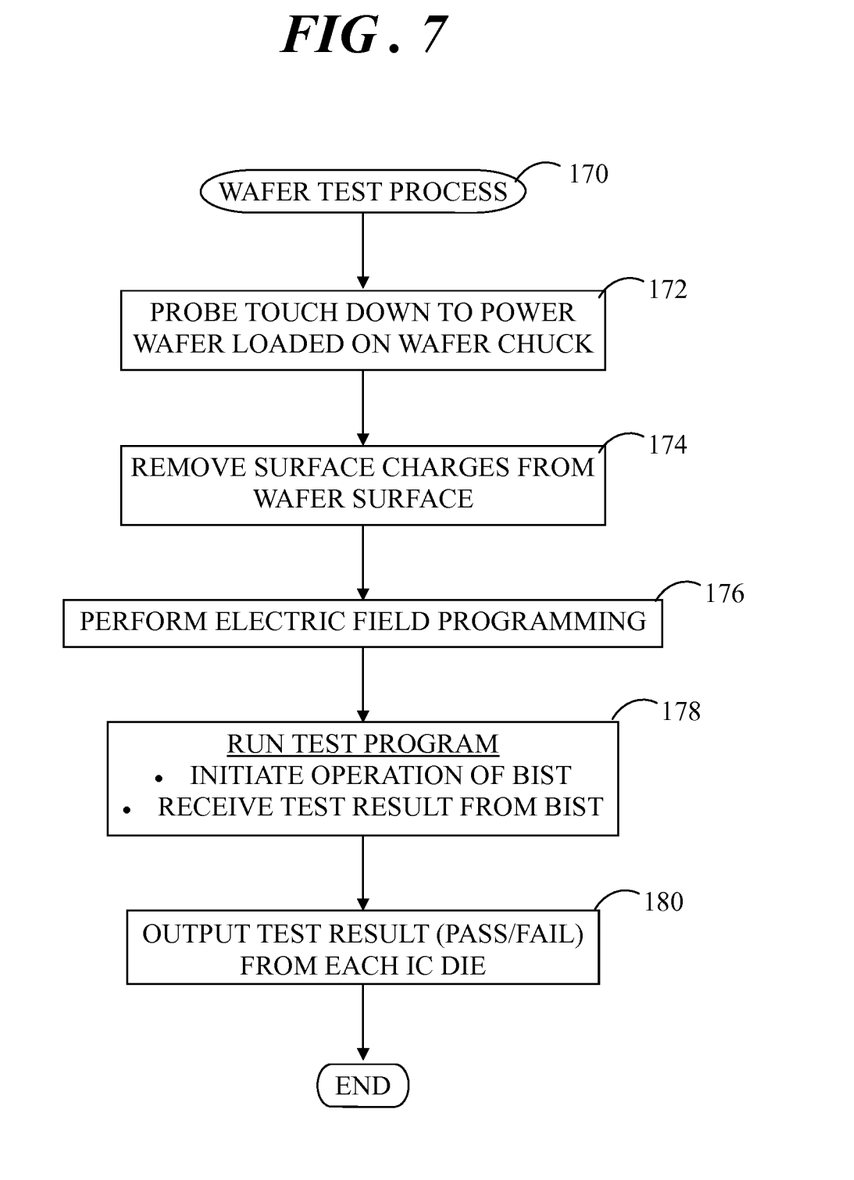
FIG. 7 shows a flowchart of a wafer test process.

Now referring to FIGS. 1 and 7, FIG. 7 shows a flowchart of a wafer test process 170 that may be performed utilizing system 20 during, for example, wafer manufacturing. Wafer test process 170 provides a generalized description of the operations for implementing a contactless electric field programming approach to concurrently program all of IC dies 22 on wafer 24. Furthermore, wafer test process 170 combines the electric field programming approach for download of a test program with built-in self-test (BIST) mechanism 70 within each of IC dies 22 in order to perform wafer level testing/probing of IC dies 22 without indexing or stepping wafer test unit 26 between each of IC dies 22 on wafer 24.

At a block 172 of wafer test process 170, touchdown of probe element(s) 46 to probe pad(s) 48 of wafer 24, loaded onto wafer chuck 90 (FIG. 3), is performed. Thus, source power 54 is supplied to wafer 24 and to constant voltage source 156 (FIG. 6) is provided to Wheatstone bridge circuit 152 (FIG. 6) of electric field sensor 60. Wafer test process 170 continues at a block 174. At block 174, surface charges are removed from surface 78 of wafer 24. Referring briefly to FIG. 4, ground element 124 of sense cell(s) 100 is coupled to ground 92 to remove, or otherwise bleed off, surface charges from exterior surface 120 of oxide layer 116, and more critically from gate region 108 of sense cell(s) 100. Thereafter, ground element 124 is decoupled from ground 92 so that gate region 108 is now a floating gate oxide layer.

With reference back to FIGS. 1 and 7, following removal of surface charges at block 174, a block 176 is performed. At block 176, remote electric field programming is performed to concurrently program all of IC dies 22 on wafer 24. Electric field programming is discussed hereinafter in connection with FIG. 8. At a block 178, the test program, i.e., digital test program 40, is run at each of IC dies 22. Execution of digital test program 40 initiates execution of BIST mechanism 70 and enables receipt at processor 62 of test result 72.

At a block 180, test result 72, e.g., PASS or FAIL, for each IC die 22 is output from its associated subsystem 32. In one example, each of IC dies 22 may be successively enabled to modulate source power 54 to produce modulated source power 74, where the specific modulation pattern indicates PASS or FAIL. Modulated source power 74 can be communicated from wafer 24 to wafer test unit 26. The PASS/FAIL state of each IC die 22 may subsequently be recorded in wafer die map 42. Following block 180, wafer level testing is complete and wafer test process 170 ends.

Figure 8:
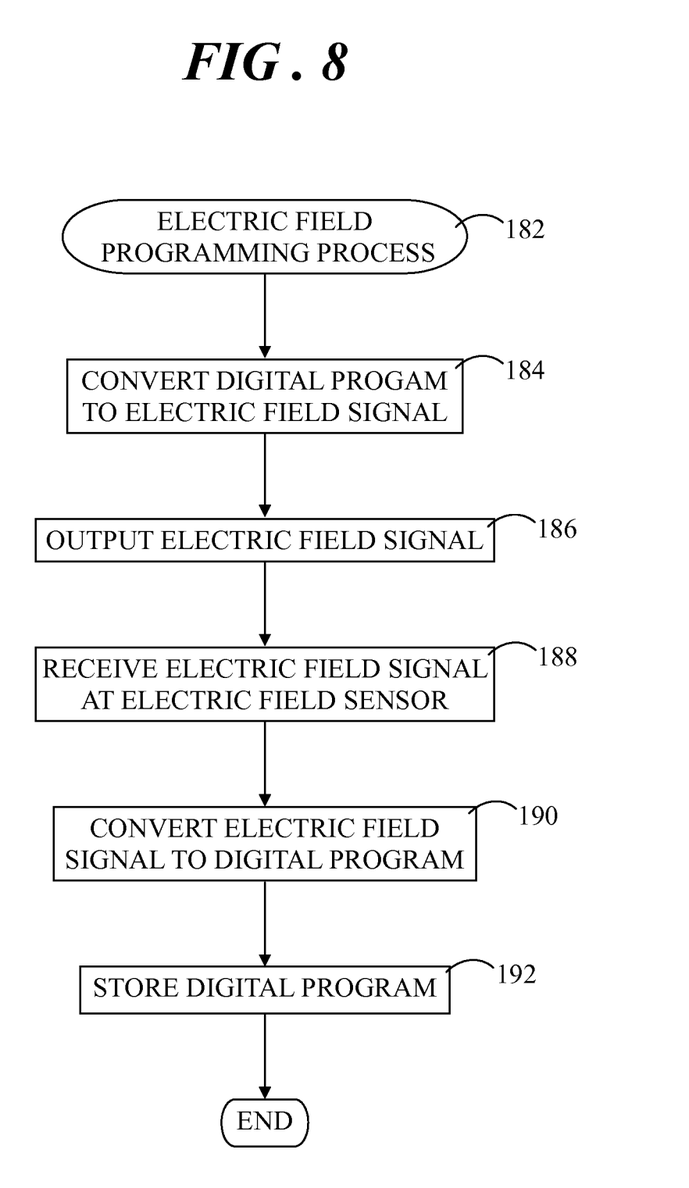
FIG. 8 shows a flowchart of a electric field programming process executed in connection with the wafer test process.

Referring now to FIGS. 1 and 8, FIG. 8 shows a flowchart of an electric field programming process 182 executed in connection with wafer test process 170 (FIG. 7). More particularly, electric field programming process 182 is performed to concurrently program all IC dies 22 on wafer 24 at block 176 of process 170 in accordance with a particular embodiment of the invention.

At a block 184 of electric field programming process 182, processor 34 and electric field source 44 suitably convert digital test program 40 to electric field signal 58, as discussed above. At a block 196, electric field source 44 outputs electric field signal 58. Again, electric field signal 58 may be sequence of pulses of predetermined voltage 96 (e.g., ON and OFF pulses), corresponding to binary code 56 of digital test program 40.

In response to the transmission of electric field signal 58 at block 186, electric field signal 58 is detected by (i.e., received at) each of electric field sensors 60, and more particularly sense cells 100 (FIG. 4) embedded in wafer 24, at a block 188. At a block 190, processors 62 in wafer 24 convert the received electric field signal 58 to digital test program 40. Thereafter, digital test program 40 is stored in memory element 64 of each subsystem 32 on wafer 24 at a block 192 and electric field programming process 182 ends. Thus, the outcome of electric field programming process 182 is to concurrently download digital test program 40 to all IC dies 22 on wafer 24 that were identified as being "good" (i.e., not having a short circuit). This downloaded and stored digital test program 40 is stored for later execution in accordance with wafer test process 170 (FIG. 7).

It is to be understood that certain ones of the process blocks depicted in FIGS. 7 and 8 may be performed in parallel with each other or with performing other processes. In addition, it is to be understood that the particular ordering of the process blocks depicted in FIGS. 7 and 8 may be modified, while achieving substantially the same result. Accordingly, such modifications are intended to be included within the scope of the inventive subject matter.

Thus, an electric field sensor, a system, and methodology for programming integrated circuit (IC) dies formed on or in a wafer have been described. An embodiment of an electric field sensor comprises a sense cell adapted to produce a first resistance which varies in accordance with an intensity of an electric field, the sense cell including a grounding element wherein the grounding element is coupled to ground prior to detection of the first resistance and following coupling, the grounding element is decoupled from ground prior to detection of the first resistance. The electric field sensor further includes a reference cell adapted to produce a second resistance that is substantially invariable relative to the intensity of the electric field, wherein an output signal indicative of the intensity of the electric field is determined in response to a difference between the first resistance and the second resistance.

An embodiment of a system for programming IC dies formed on a wafer comprises an electric field source configured to output a digital program as an electric field signal and an electric field sensor formed with the IC dies of the wafer, the electric field sensor being configured to receive the electric field signal from the electric field source and produce an output signal indicative of an intensity of the electric field signal. The system further comprises a processor formed on the wafer and in communication with the electric field sensor, the processor being adapted to convert the output signal to the digital program, and a memory element associated with one of the IC dies on the wafer, the memory element being adapted to store the digital program.

An embodiment of a method of programming IC dies formed on a wafer comprises transmitting a digital program as an electric field signal from an electric field source and receiving the electric field signal from the electric field source at an electric field sensor formed with the IC dies of the wafer, the electric field sensor including a sense cell and a reference cell. The sense cell is adapted to produce a first resistance which varies in accordance with an intensity of the electric field signal, and the reference cell is adapted to produce a second resistance that is substantially invariable relative to the intensity of the electric field signal, wherein an output signal indicative of the intensity of the electric field signal is determined in response to a difference between the first resistance and the second resistance. The method further comprises converting the output signal to the digital program at a processor formed on the wafer and in communication with the electric field source and storing the digital program in a memory element associated with one of the IC dies on the wafer.

The sensor, system, and methodology, discussed above, and the inventive principles thereof enable a remote electric field programming approach to concurrently program all of the IC dies on a wafer without the need for separate communication between the test unit and each individual IC die. Accordingly, test time and cost can be dramatically reduced. Furthermore, by combining the electric field programming approach for download of a test program with built-in self-test (BIST) functionality, wafer level testing/probing of the IC dies can be carried out without indexing or stepping the tester between each of the IC dies on the wafer in order to further reduce test time and test cost.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiments were chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A system for programming integrated circuit (IC) dies formed on a wafer comprising:
    an electric field source configured to output a digital program as an electric field signal;
    an electric field sensor formed with said IC dies of said wafer, said electric field sensor being configured to receive said electric field signal from said electric field source and produce an output signal indicative of an intensity of said electric field signal;
    a processor formed on said wafer and in communication with said electric field sensor, said processor being adapted to convert said output signal to said digital program; and
    a memory element associated with one of said IC dies on said wafer, said memory element being adapted to store said digital program, wherein said one of said IC dies includes a built-in self-test (BIST) mechanism to determine said functionality of said one of said IC dies, said processor is configured to communicate with said BIST mechanism, and said processor is further configured to execute said digital program, wherein execution of said digital program initiates operation of said BIST mechanism and receipt of a test result from said BIST mechanism, said test result being result indicative of a functionality of said one of said IC dies.

2. The system of claim 1 wherein said electric field source does not physically contact said IC dies.

3. The system of claim 1 wherein said electric field source is adapted to modulate said digital program as a sequence of pulses, said sequence of pulses forming said electric field signal.

4. The system of claim 1 wherein said electric field source is configured to flood an entire surface of said wafer with said electric field signal.

5. The system of claim 1 wherein said electric field sensor comprises:
    a sense cell adapted to produce a first resistance which varies in accordance with an intensity of said electric field signal; and
    a reference cell adapted to produce a second resistance that is substantially invariable relative to said intensity of said electric field signal, wherein said output signal is determined in response to a difference between said first resistance and said second resistance.

6. The system of claim 5 wherein said sense cell is a first sense cell, said reference cell is a first reference cell, and said electric field sensor further comprises:
    a second sense cell adapted to produce a third resistance which varies in accordance with said intensity of said electric field signal; and
    a second reference cell adapted to produce a fourth resistance that is substantially invariable relative to said intensity of said electric field signal, wherein said first sense cell, said first reference cell, said second sense cell, and said second reference cell are connected to define a Wheatstone bridge circuit.

7. The system of claim 5 wherein said sense cell includes a first source region, a first drain region, a first gate region, and a first resistance channel electrically interconnecting said first source region with said first drain region, said first resistance channel having said first resistance, wherein said first gate region is coupled to ground prior to detection of said first resistance and following coupling, said gate region is decoupled from said ground prior to detection of said first resistance.

8. The system of claim 1 wherein electric field sensor is one of a plurality of electric field sensors, one each of said electric field sensors being formed with one each of said IC dies of said wafer.

9. A system for programming integrated circuit (IC) dies formed on a wafer comprising:
    a wafer test unit having a probe card, an electric field source, and a probe element coupled to said probe card, wherein said electric field source is configured to output a digital program as an electric field signal, and said probe element provides source power;

a probe pad on said wafer and electrically coupled with said IC dies, said probe element being configured for touchdown on said probe pad to selectively provide said source power to each of said IC dies;

an electric field sensor formed with said IC dies of said wafer, said electric field sensor being configured to receive said electric field signal from said electric field source and produce an output signal indicative of an intensity of said electric field signal;

a processor formed on said wafer and in communication with said electric field sensor, said processor being adapted to convert said output signal to said digital program; and a memory element associated with one of said IC dies on said wafer, said memory element being adapted to store said digital program, wherein said processor is further configured to execute said digital program, receive a test result indicative of a functionality of said one of said IC dies, and modulate said source power in accordance with said test result to return said test result to said wafer test unit.

10. A method of programming integrated circuit (IC) dies formed on a wafer comprising:

transmitting a digital program as an electric field signal from an electric field source;

receiving said electric field signal from said electric field source at an electric field sensor formed with said IC dies of said wafer, said electric field sensor including a sense cell and a reference cell, said sense cell being adapted to produce a first resistance which varies in accordance with an intensity of said electric field signal, and said reference cell being adapted to produce a second resistance that is substantially invariable relative to said intensity of said electric field signal, wherein an output signal indicative of said intensity of said electric field signal is determined in response to a difference between said first resistance and said second resistance;

converting said output signal to said digital program at a processor formed on said wafer and in communication with said electric field source;

storing said digital program in a memory element associated with one of said IC dies on said wafer, wherein said one of said IC dies includes a built-in self-test (BIST) mechanism to determine a functionality of said one of said IC dies; and executing, at said processor, said digital program, wherein execution of said digital program initiates operation of said BIST mechanism and receipt of a test result from said BIST mechanism, said test result being indicative of a functionality of said one of said IC dies.

11. The method of claim 10 further comprising:

fabricating said wafer to include a plurality of subsystems, one each of said subsystems being formed with one each of said IC dies of said wafer, each of said subsystems comprising said electric field sensor, said processor in communication with said electric field sensor, and said memory element in communication with said processor; and flooding an entire surface of said wafer with said electric field signal such that each of said subsystems concurrently receives said electric field signal, converts said electric field signal to said digital program, and stores said digital program in association with said one each of said IC dies.

12. The method of claim 10 wherein said sense cell includes a source region, a drain region, a gate region, and a resistance channel electrically interconnecting said source region with said drain region, said resistance channel having said first resistance, and said method comprises:

coupling said gate region to ground prior to producing said first resistance; and following said coupling, decoupling said gate region from said ground prior to producing said first resistance, said coupling and decoupling operations substantially removing surface charge from a surface of said wafer.

13. The method of claim 10 further comprising:

providing source power via a wafer test unit; and selectively providing said source power to each of said IC dies by touchdown of said probe element onto a probe pad on said wafer, said probe pad being electrically coupled with said IC dies.

14. The method of claim 13 further comprising:

a wafer test unit having a probe card, said electric field source and a probe element being coupled to said probe card, wherein said probe element provides source power; and a probe pad on said wafer and electrically coupled with said IC dies, said probe element being configured for touchdown on said probe pad to selectively provide said source power to each of said IC dies, wherein said processor is further configured to execute said digital program, receive a test result indicative of a functionality of said one of said IC dies; and modulating said source power at said processor in accordance with said test result to return said test result to said wafer test unit.

\* \* \* \* \*